(12) United States Patent
Liu et al.

(10) Patent No.: US 7,017,795 B2
(45) Date of Patent: Mar. 28, 2006

(54) SOLDER PASTES FOR PROVIDING HIGH ELASTICITY, LOW RIGIDITY SOLDER JOINTS

(75) Inventors: Yan Liu, Clinton, NY (US); Derrick Herron, Utica, NY (US); Ning-Cheng Lee, New Hartford, NY (US)

(73) Assignee: Indium Corporation of America, Utica, NY (US)

( * ) Notice: Subject to any disclaimer, the term of this patent is extended or adjusted under 35 U.S.C. 154(b) by 0 days.

(21) Appl. No.: 10/954,570

(22) Filed: Oct. 1, 2004

(65) Prior Publication Data

US 2005/0092819 A1    May 5, 2005

Related U.S. Application Data

(60) Provisional application No. 60/516,274, filed on Nov. 3, 2003.

(51) Int. Cl.
    *B23K 35/12* (2006.01)
(52) U.S. Cl. .................. 228/248.1; 228/248.5; 148/23
(58) Field of Classification Search ............ 228/248.1, 228/248.5; 148/23, 24
    See application file for complete search history.

(56) References Cited

U.S. PATENT DOCUMENTS

| | | | | |
|---|---|---|---|---|
| 4,680,141 A | * | 7/1987 | Barajas | 252/512 |
| 4,834,794 A | * | 5/1989 | Yagi et al. | 75/255 |
| 4,976,806 A | * | 12/1990 | Iwamoto et al. | 156/325 |
| 5,088,007 A | | 2/1992 | Missele | |
| 5,229,070 A | * | 7/1993 | Melton et al. | 420/557 |
| 5,382,300 A | * | 1/1995 | Blonder et al. | 148/24 |
| 5,803,340 A | * | 9/1998 | Yeh et al. | 228/56.3 |
| 5,837,356 A | * | 11/1998 | Katori et al. | 428/210 |
| 5,928,404 A | * | 7/1999 | Paruchuri et al. | 75/255 |
| 6,127,727 A | * | 10/2000 | Eytcheson | 257/692 |
| 6,214,636 B1 | * | 4/2001 | Sawayama et al. | 438/57 |
| 6,340,113 B1 | | 1/2002 | Avery et al. | |
| 6,359,235 B1 | | 3/2002 | Hayashi | |
| 6,360,939 B1 | | 3/2002 | Paruchuri et al. | |
| 6,391,123 B1 | * | 5/2002 | Nakamura et al. | 148/24 |
| 6,518,163 B1 | * | 2/2003 | Sakuyama et al. | 438/613 |
| 6,670,264 B1 | * | 12/2003 | Sakuyama et al. | 438/610 |
| 2002/0012607 A1 | * | 1/2002 | Corbin et al. | 420/558 |
| 2002/0040624 A1 | * | 4/2002 | Nakamura et al. | 75/252 |
| 2003/0178476 A1 | * | 9/2003 | Kanai et al. | 228/248.1 |
| 2005/0034791 A1 | * | 2/2005 | Lee et al. | 148/400 |

FOREIGN PATENT DOCUMENTS

| | | | |
|---|---|---|---|
| DE | 19547680 A1 | * | 6/1997 |
| JP | 401268186 A | | 1/1989 |
| JP | 2000223831 A | * | 8/2000 |
| JP | 2001259884 A | * | 9/2001 |
| JP | 2004009106 A | * | 1/2004 |

\* cited by examiner

*Primary Examiner*—Jonathan Johnson
(74) *Attorney, Agent, or Firm*—Hunton & Williams LLP

(57) ABSTRACT

Solder pastes for providing high elasticity, low rigidity solder joints are disclosed. The solder pastes may be used between two parts having large mismatches in their coefficients of thermal expansion and/or when there is a high likelihood of mechanical deformity when the two parts are soldered together. In one particular exemplary embodiment, a solder paste may be realized as a composition comprising a solder powder and high melting temperature particles with a flux, wherein the ratio between solder powder and high melting temperature particles may be between 2:1 and 1:10.

19 Claims, 4 Drawing Sheets

SOLDER PASTES FOR PROVIDING HIGH ELASTICITY, LOW RIGIDITY SOLDER JOINTS

CROSS-REFERENCE TO RELATED APPLICATIONS

This patent application claims priority to U.S. Provisional Application No. 60/516,274, filed Nov. 3, 2003, which is hereby incorporated by reference herein in its entirety.

FIELD OF THE DISCLOSURE

The present disclosure relates generally to compositions and methods of using the compositions for connection of materials, and, more particularly, to electronic and/or mechanical parts. The disclosure further provides for advanced interconnection solder pastes for electronic and/or mechanical parts, comprised of at least two different materials.

BACKGROUND OF THE DISCLOSURE

The present state of the art is that in many modern electronic devices, parts are bonded together by solder interconnections. The bonded parts are often composed of materials with significantly different coefficients of thermal expansion (CTE). For instance, a ceramic electronic device, with low CTE, may be soldered onto a polymeric printed circuit board with a high CTE.

The problems with the present state of the art are, for instance, problems that often arise due to significant mismatches in CTE. Bending of an electronic device during handling or service can further aggravate these mismatches in physical dimensions between parts.

Typically, solder paste is comprised of solder powder and a flux vehicle. The solder powder is typically an alloy of two or more elements, which melt at a soldering temperature. When mixed with a flux vehicle, a paste is formed. The paste may be printed onto a circuit board using a stencil. Electronic components may be placed on top of the paste and the entire assembly may be placed inside an oven set at a temperature higher than the melting point of the alloy. The solder melts and wets both the component and pads on the board. When the temperature is decreased, the solder solidifies, joining the components to the board with a solid solder joint.

A standard solder joint is a solid piece of solder bonding together two parts. If a solder joint is weak, the joint may rupture quickly and typically results in device and system failure. If a solder joint is soft and compliant, such as when an Indium-Tin compound (e.g. 52In48Sn) is used, it may deform to cope with a small mismatch in the CTE's or physical dimensions between parts. However, in the case of a large mismatch in the CTE's or physical dimensions between parts, even a soft solder joint may be unable to cope and joint rupture typically results.

Contrarily, if a solder joint is very strong, a new problem set arises. For instance, U.S. Pat. No. 5,088,007 uses copper fiber or copper filler in a solder joint to provide further reinforcement on the solder joint strength. This composite solder generally makes the solder joint harder and stronger resulting in fairly durable joints for devices with small mismatches in the CTE's or physical dimensions between parts. However, for devices with large mismatches in the CTE's or physical dimensions between parts, the stresses resulting from these mismatches do not disappear due to the use of strong rigid composite solder joints. For instance, if a solder joint itself is too strong to fail, a device may fail at spots weaker than the joint, such as at the bonding between solder and pads, the bonding between solder and devices, or the body of a board/device itself, in order to relieve the stress.

The fatigue resistance of solder joints for a system with mismatches in the CTE's or physical dimensions between parts can be improved by increasing joint standoff. For instance, U.S. Pat. No. 6,360,939 describes a way to increase the standoff between a component and a substrate. In this process, high melting temperature metal particles are mixed with lead-free solder powder (approximately 3–10% of the total metal weight), and then a solder paste is made using this metal mixture. The high melting temperature metal particles give the solder a larger standoff value for the substrate than normal solder powder allows, purportedly resulting in an increase in fatigue life. However, the validity of this approach is compromised by the particle size allowed for in an associated dispensing or printing process. Large high melting temperature metal particles do not allow adequate solder paste dispensing or printing. On the other hand, small high melting temperature metal particles do not provide sufficient standoff, such that the solder joint is unable to cope with a large mismatch in the CTE's or physical dimensions between parts. The end result is a solder joint that is solid. Much like concrete, the solder is strengthened by the filler material, resulting in a more rigid joint. Although this rigid joint offers some advantage for typical electronic products, the rigidity could cause joint or component cracking particularly in the case of a large mismatch in the CTE's or physical dimensions between parts.

U.S. Pat. No. 6,340,113 ('113) describes a process for producing a solder joint without melting down whole solder constituents. The purpose is to eliminate slump and spread of solder paste during the soldering process by avoiding the melting of solder particles. Purportedly, this very porous joint reduces the potential for joint fatigue. The method of producing a solder joint in this patent relies on solid state diffusion, in which a tin particle is coated with a thin layer of lead. When heated at a temperature below the melting temperature (232° C.) of tin, tin atoms diffuse into the outer lead layer and forms a very thin layer of tin-lead alloy with the tin content continuously increasing from 0% up to a high content. This thin layer of tin-lead alloy exhibits a solidus temperature of 183° C. for most of the composition formed by solid-phase diffusion. If the soldering process is maintained at a temperature higher than the solidus temperature, the thin outer tin-lead layer on the tin particle remains at a pasty or liquid state. Upon contact with neighboring tin particles, the thin outer liquid layer could coalesce and form a liquid solder bridge between neighboring tin particles. When the joint is cooled down, tin particle aggregates are bonded together by a thin layer of tin-lead solder to form a network of connected particles. Within this network, inter-particle spaces remain and a joint is formed with some porosity.

The '113 method is very labor intensive and requires the coating of metal particles with a second metal surface by plating, which is both time consuming and cost prohibitive. The '113 patent also requires a maximum temperature below the melting temperature of tin (232° C.) and lead (327° C.), but above the solidus temperature (183° C.) of tin-lead alloy. In the electronic industry, it is common practice to heat solder paste up to a temperature at least 20° C. above the melting temperature of solder, or 203° C. in the case of tin lead solder (e.g., 63Sn37Pb) in order to allow sufficient solder wetting and form an acceptable solder joint, leaving a 29° C. processing window (between 232° C. and 203° C.) for tin-lead solder systems. However, if a solder joint with a prevailing lead-free solder of tin-silver-copper (melting temperature 217° C.) is to be formed, the maximum temperature must be below the melting temperature of tin, but at least 20° C. above that of the tin-silver-copper (217° C.) surface coating on the tin particles. In other words, the maximum temperature (232° C.) allowed to retain the solid state of the tin would be below the minimum temperature (237° C.) needed to get sufficient solder wetting of the tin-silver-copper alloy, effectively leaving no process window for main-stream lead-free tin-silver-copper solder systems. The impracticalities of the '113 approach to lead-free solder systems virtually eliminates its application in the electronic industry.

Due to the toxicity of lead, lead is to be globally banned from use in the electronic industry on Jul. 1, 2006. Therefore, new solders are required to be lead-free if they are intended to be used beyond Jul. 1, 2006.

When solder paste is deposited by printing or dispensing, and then reflowed between a substrate and an electrical component having a large mismatch in the CTE's or physical dimensions between parts, joint cracking or fatigue failure typically results either right after the soldering process or during service. Therefore, there is a need for compositions and methods to relieve joint strain through a porous solder joint which exhibits a high elasticity and low rigidity while maintaining formable characteristics through a regular soldering process.

SUMMARY OF THE DISCLOSURE

Solder pastes for providing high elasticity, low rigidity solder joints are disclosed. The solder pastes may be used between two parts having large mismatches in their coefficients of thermal expansion and/or when there is a high likelihood of mechanical deformity when the two parts are soldered together. In one particular exemplary embodiment, a solder paste may be realized as a composition comprising a solder powder and a high melting temperature particle, optionally with a flux, wherein the solder powder to high melting temperature particle ratio is between 2:1 and 1:10.

In another exemplary embodiment, a method of using a solder paste is disclosed resulting in a new solder interconnection with high elasticity and low rigidity when two parts being soldered together have a large mismatch in their coefficients of thermal expansion or have a high likelihood of mechanical deformity. The solder paste may be made by blending flux with a mixture of particles comprised of a dominant volume fraction of high melting temperature particles having solderable surfaces and a minor volume fraction of solder powder.

In accordance with another embodiment, a method of manufacturing a solder joint is disclosed comprising mixing a solder powder and a high melting temperature particle with a flux to form a solder paste, wherein the solder paste has a volume ratio of solder powder to high melting temperature particle between 2:1 and 1:10.

In accordance with another embodiment, a method for connecting electrical and/or mechanical components with solder interconnections is disclosed comprising:

(a) mixing a solder powder, a high melting temperature particle material, and a flux to form a solder paste;
(b) dispensing or printing the solder paste onto a pad;
(c) placing a component onto the deposited solder paste to make an assembly;
(d) heating the assembly to a temperature above the melting temperature of the solder, but below that of the high melting temperature particle material; and
(e) cooling the assembly.

For each embodiment of the disclosure, one may use a no-clean flux. No-clean fluxes may comprise, for example, NC-SMQ230, RMA-SMQ51A, RMA-SMQ51AC, RMA-M, NC-SMQ92J, NC-SMQ71, or mixtures thereof.

For each embodiment of the disclosure, exemplary high melting temperature particles may be selected from materials such as, for example, copper, nickel, or polymeric particles with a solderable metal coating, with melting temperatures considerably higher than a soldering temperature range.

For each embodiment of the disclosure, the high melting temperature particles may be chemically treated prior to powder and flux.

In accordance with another embodiment of the disclosure, the high melting temperature particles determine the shape of a joint. In another aspect of the disclosure, the solder joint comprises space between the high melting temperature particles. In another aspect of the disclosure, the solder joint can stretch between 1 mil and 30 mils as measured by an MTS lap shear tester and increments therein.

In accordance with another embodiment of the disclosure, the solder joint has a porosity between 2% and 80% and increments therein as measured by cross sectioning and visual approximations.

In accordance with another embodiment of the disclosure, a component lead comprises a solder precoat to facilitate solder wetting.

In accordance with other aspects of particular exemplary embodiments of the disclosure, the high melting temperature particles may be pretreated chemically so that their surfaces are protected by surface finishes which can preserve solderability, inhibit the reaction between particles and flux, and/or enhance the reliability of solder joints.

In accordance with further aspects of particular exemplary embodiments of the present disclosure, when reflowed at a temperature above that of the solder powder but below the melting temperature of the high melting temperature particles material, the solder wets to the surfaces of the high melting temperature particles material, forming a porous joint comprised of an aggregate of high melting temperature particles interconnected by solder bridges.

In accordance with additional aspects of particular exemplary embodiments of the present disclosure, the solder may also bond to pads of parts through solder wetting. The high porosity of the interconnection increases elasticity and reduces rigidity or modulus of a solder joint, thus allowing a high compliance for solder joints and hence a high tolerance against a mismatch in physical dimension between parts due to a large mismatch in their coefficients of thermal expansion or due to mechanical deformation during service life, and consequently grants a high fatigue resistance.

The present disclosure will now be described in more detail with reference to exemplary embodiments thereof as shown in the accompanying drawings. While the present disclosure is described below with reference to exemplary embodiments, it should be understood that the present disclosure is not limited thereto. Those of ordinary skill in the art having access to the teachings herein will recognize additional implementations, modifications, and embodiments, as well as other fields of use, which are within the scope of the present disclosure as described herein, and with respect to which the present disclosure could be of significant utility.

BRIEF DESCRIPTION OF THE DRAWINGS

In order to facilitate a fuller understanding of the present disclosure, reference is now made to the accompanying drawings, in which like elements are referenced with like numerals. These drawings should not be construed as limiting the present disclosure, but are intended to be exemplary only.

DETAILED DESCRIPTION OF THE EXEMPLARY EMBODIMENTS

Figure 1:
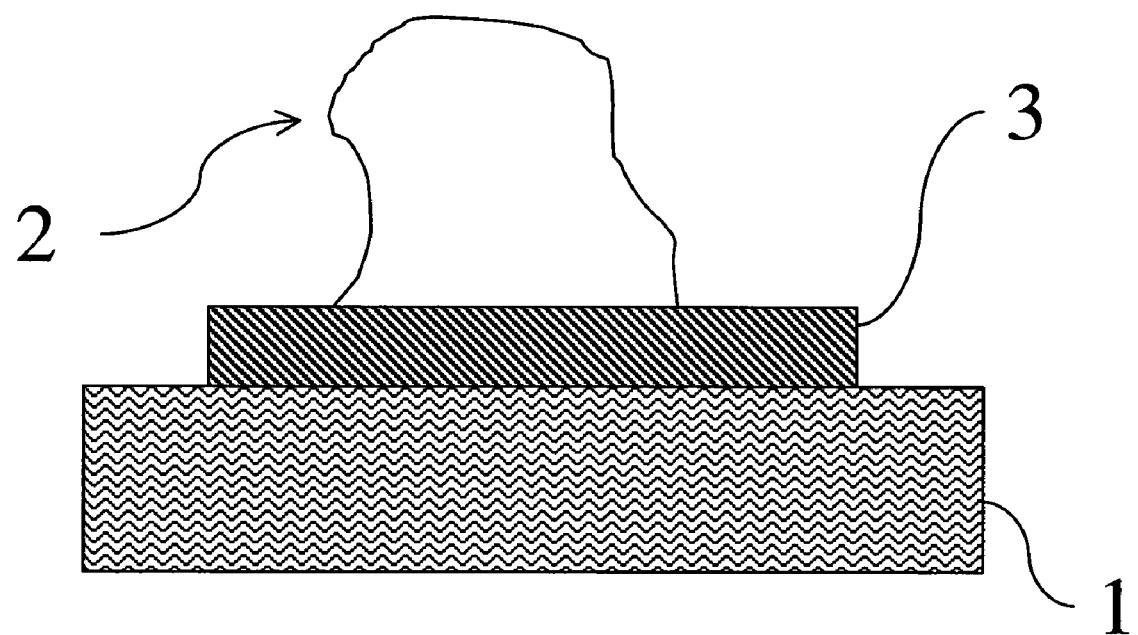
FIG. 1 shows a substrate and an electrical component in accordance with an embodiment of the present disclosure.

The present disclosure is directed to providing solder pastes for use in creating solder joints with high elasticity, low rigidity or low modulus, and high strength. Being solder in nature, the joint may be formed between two solderable surfaces at soldering. Under stress due to a large mismatch in the coefficients of thermal expansion or mechanical deformity between parts, the low rigidity or low modulus of the solder joints allow the joints to stretch. The high elasticity of the solder joints also prevents the joints from rupturing and allows changes in joint shape to be reversible. Accordingly, the solder pastes of the disclosure may be used to create solder joints able to tolerate large mismatches in physical dimensions between parts due to thermal expansion or contraction and/or mechanical deformity and exhibit a high fatigue resistance.

The solder pastes of the disclosure may use a high volume fraction of high melting temperature particles (volume ratios of solder to high melting particle range from 2:1 to 1:10) to produce a porous solder joint. The solder pastes of the disclosure result in a spongy, or porous, solder joint. The spongy nature of the solder joint gives a high elasticity, low rigidity solder joint, able to increase fatigue life and lessen cracking through the ability to stretch in response to mismatches in the coefficients of thermal expansion or mechanical deformity between parts.

The high melting temperature solderable particles may be formed, for example, of any metal or commonly used solder material, such as copper, nickel, or polymeric materials with a solderable metal coating, with melting temperatures considerably higher than a soldering temperature range. As a result, the solder pastes of the disclosure are applicable to all solder alloy systems, including all lead-free solder systems. There is no constraint on the maximum soldering temperature allowed for the solder pastes of the disclosure, other than the thermal stability limit of components and printed circuit boards. The solder pastes of the disclosure may use an easy, cheap particle blending approach, by mixing a high volume fraction of high melting temperature particles with a small volume fraction of solder powder, to produce a porous solder joint. The dominant volume fraction phase of high melting temperature solderable particles is interspersed within a minor volume fraction phase of solder in the joint, making the interconnect more elastic and less rigid, hence it is able to greatly reduce the potential for joint fatigue and cracking.

The solder pastes of the disclosure may utilize regular solder powder and blend it with a large volume fraction of high melting temperature particles that have a solderable surface. These high melting temperature particles can be either regular or irregular in shape. They may also be pretreated chemically to form a protective coating to preserve the solderability, to inhibit the reaction between flux and particle, and to enhance the reliability of solder joints. This powder blend is then mixed with a flux vehicle to form a solder paste. When heated to soldering temperature, the small volume fraction of solder powder wets and joins neighboring high melting temperature particles to form a network of connected high melting temperature particles. The solder powder may also be used to bond a network to components and pads on a board. Instead of forming a solid solder joint between the two parts, a component and a pad on the board, a very porous joint is formed because there is not enough solder to fill all the gaps within the aggregate of high melting temperature particles.

As the flux residue remains in the spongy solder joints, it is benign, non-corrosive, and non-conductive in nature (i.e. a "no-clean" flux). However, any common fluxes may be used such as those containing fluxing agent, tackifiers, rheological additives, and solvents provided they meet the above proviso. Examples of common flux include NC-SMQ230, RMA-SMQ51A, RMA-SMQ51AC, RMA-M, NC-SMQ92J, NC-SMQ71. In one particular embodiment of the disclosure, the flux may be selected from NC-SMQ230, NC-SMQ92J, and RMA-SMQ51AC.

The present disclosure provides solder compositions and methods for providing solder compositions. More particularly, the compositions comprise a small volume fraction of solder powder combined with a large volume fraction of high melting temperature particles to form a solder paste. It should be recognized that chemical pretreatment or flux may be used together or alone with the different exemplary embodiments of the disclosure. In one embodiment, the solder pastes of the disclosure may use a mixture of solder and high melting temperature particles in a volume ratio of 2:1 to 1:10 or increments therein, to provide a porous solder joint. Due to the high porosity of the joint, a low rigidity and high elasticity joint will result, and the fatigue resistance against a high mismatch in physical dimensions caused by mismatch in coefficients of thermal expansion or mechanical deformity between parts will be imparted.

In another embodiment, a method of manufacturing a solder joint with high elasticity and low rigidity or low modulus is disclosed comprising mixing a solder powder and high melting temperature particles that have solderable surfaces with a no-clean flux to form a solder paste wherein the solder paste has a volume ratio of solder to high melting temperature particles between 2:1 and 1:10.

The high melting temperature particles may be treated chemically, prior to mixing the solder powder and flux. In another embodiment, pretreatment provides a surface that is coated with a protective layer which improves one or more of the following: (1) the retention of solderability; (2) the increased inhibition of the reaction between flux and the high melting particles; and (3) the enhanced reliability of the solder connections between the high melting temperature particles.

In another embodiment, a method for connecting electrical and/or mechanical components with solder interconnections is disclosed comprising (a) mixing a solder powder, a high melting temperature particle material that has a solderable surface, and a no-clean flux to form a solder paste; (b) dispensing or printing the solder paste onto a pad on a substrate surface using a stencil followed by removal of the stencil from the substrate surface; (c) placing a component onto the deposited solder paste to make an assembly; (d) heating the assembly to a temperature above the melting temperature of the solder, but below that of the high melting temperature particle material, causing the solder to melt and flow, then wet to the surfaces of the pads on the substrate and component, as well as to the surfaces of the high melting particles; and (e) cooling the assembly and allowing the solder joint to cool, and solidify into a solid joint that connects the high melting temperature particles.

Each of the described embodiments may comprise high melting temperature particles which are treated chemically, prior to mixing the solder powder and flux. In another embodiment, a component lead or pad on a substrate may or may not have a solder precoat to facilitate the solder wetting. In another embodiment, the aggregate of the high melting temperature particles dictate the shape of the joint. In another embodiment, solder forms empty spaces within the aggregates of high melting temperature particles while still providing a connection.

After reflow, a cross section can be made of the solder joint. When the cross section is examined, pores can be seen within the joint. For pastes containing a low ratio of high melting temperature particles, pores make up approximately 2% of the total solder volume. For pastes containing a large ratio of high melting temperature particles, pores make up approximately 80% of the total solder volume.

As each material that may be utilized for the components has a different coefficient of thermal expansion, which can be looked up in reference books such as the CRC Handbook of Physics and Chemistry, the coefficients of thermal expansion for the two components can be compared and used to determine the best materials for the desired application. There is no upper and lower limit, as these numbers depend on the temperature and the substance being used. When the coefficient of thermal expansion values are different, the spongy solder will respond to the changes in size as the materials expand and contract. Mechanical deformity may be defined as the strain for the materials selected which may be determined by final length divided by original length.

In summary, the present disclosure provides solder paste compositions and methods of using solder pastes to form solder joints with high porosity. Similar to a sponge, the high porosity allows the joint to reshape into an elongated joint under stress. The curvilinear shape of the solder connections within the aggregates of high melting temperature particles interconnected by solder allows considerable room for stretching and deforming the joints. The deformation modes of solder interconnections between the high melting temperature particles include shearing, bending, and tensile stretching, depending on the relative orientation of solder interconnections within the porous joint. Exemplary embodiments of various aspects are further described below through the description of FIGS. 1 through 4.

As shown in FIG. 1, a solder paste 2 may be deposited onto a pad 3 on a substrate 1 using standard dispensing or printing methods where the solder paste 2 is pushed through an aperture of a stencil (not shown) with a squeegee (not shown) onto the pad 3 on the substrate 1. Once the stencil is lifted, the solder paste 2 remains on the pad 3 in the shape of the aperture through which it was printed. The pad 3 on the substrate 1 is solderable. A solder precoat, such as that produced by hot air solder leveling, on the pad 3 is not necessary, but may further facilitate solder wetting onto the pad 3.

Figure 2:
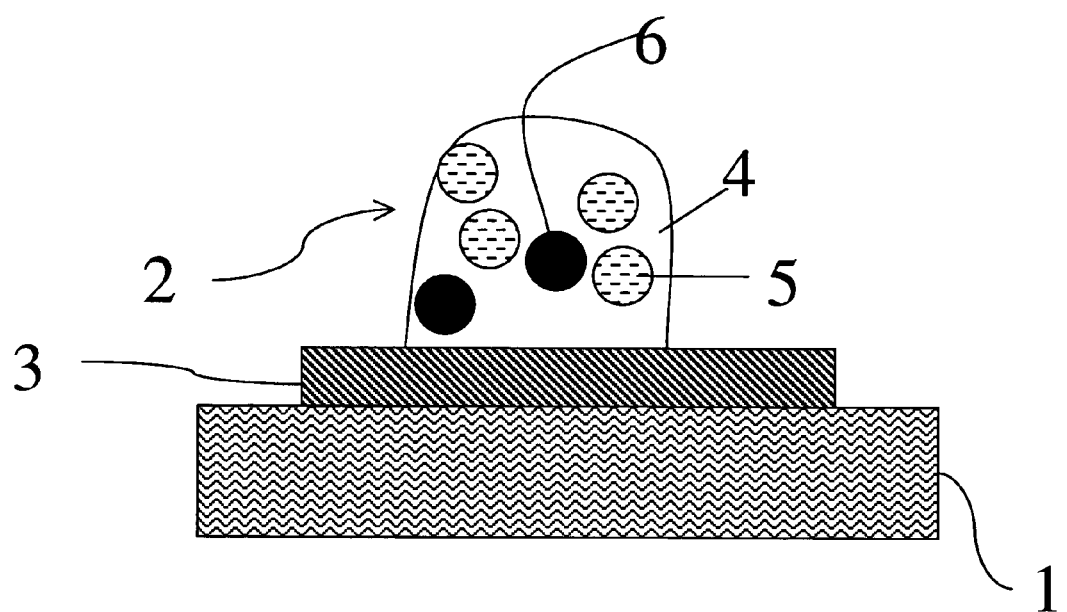
FIG. 2 shows solder paste printed on a pad of a substrate in accordance with an embodiment of the present disclosure.

As is shown in FIG. 2, the solder paste 2 may comprise solder powder 6, high melting temperature particles with a solderable surface 5, and a no-clean flux 4 (between the particles) of which the residue may not need to be cleaned. The high melting temperature particles with a solderable surface 5 may be, for example, copper, nickel, a polymeric particle with metal coating, etc. Prior to blending with solder powder 6 and flux 4, the high melting temperature particles 5 are preferably pretreated chemically, so that the surface is coated with a protective layer. Chemical pretreatments include, but are not limited to, Organic Solderability Preservatives (OSP), gold (Au) immersion, tin (Sn) immersion, an electroless combination of nickel (Ni) immersion and gold (Au) immersion, palladium (Pd) coating, or other surface finishes. Pretreatment may provide improved (1) retention of solderability, (2) inhibition of the reaction between flux and particles, and (3) enhanced reliability of solder connections between high melting temperature particles by minimizing intermetallics formation.

Figure 3:
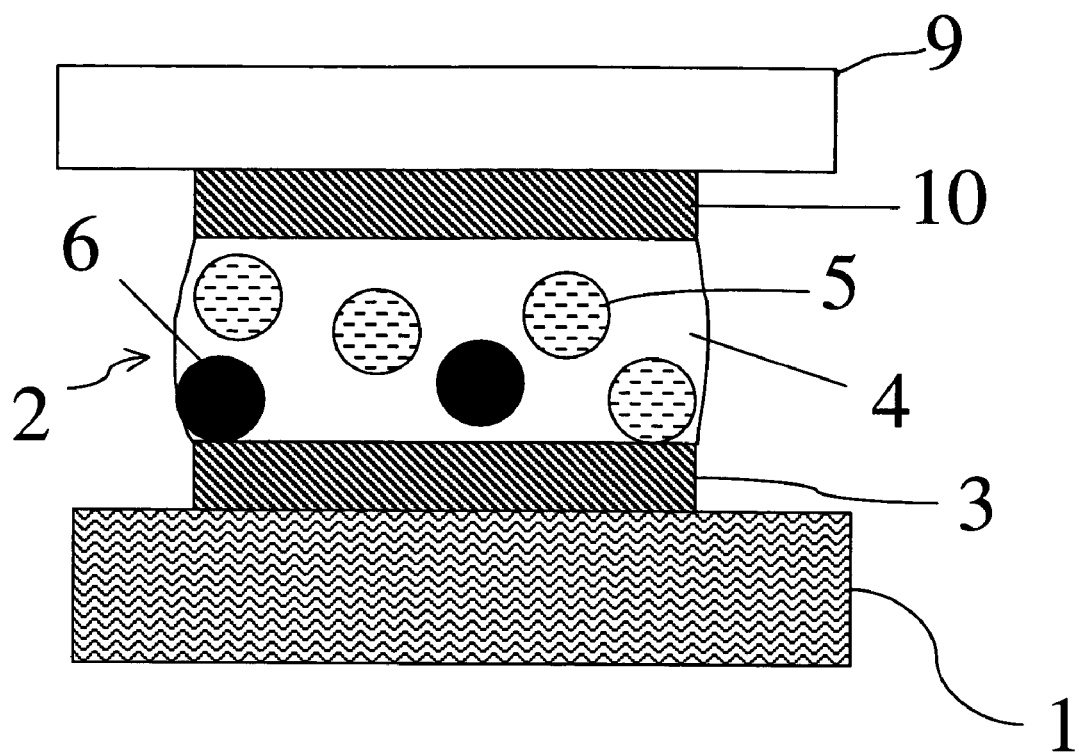
FIG. 3 shows an electrical component placed on top of the printed paste in accordance with an embodiment of the present disclosure.

As shown in FIG. 3, a component 9 having a pad 10 may be aligned with and set on top of the deposited paste 2. The entire assembly may then be placed inside a reflow oven and heated to a temperature above the melting point of the solder powder 6 but much less than the melting point of the high melting temperature particles 5.

Figure 4:
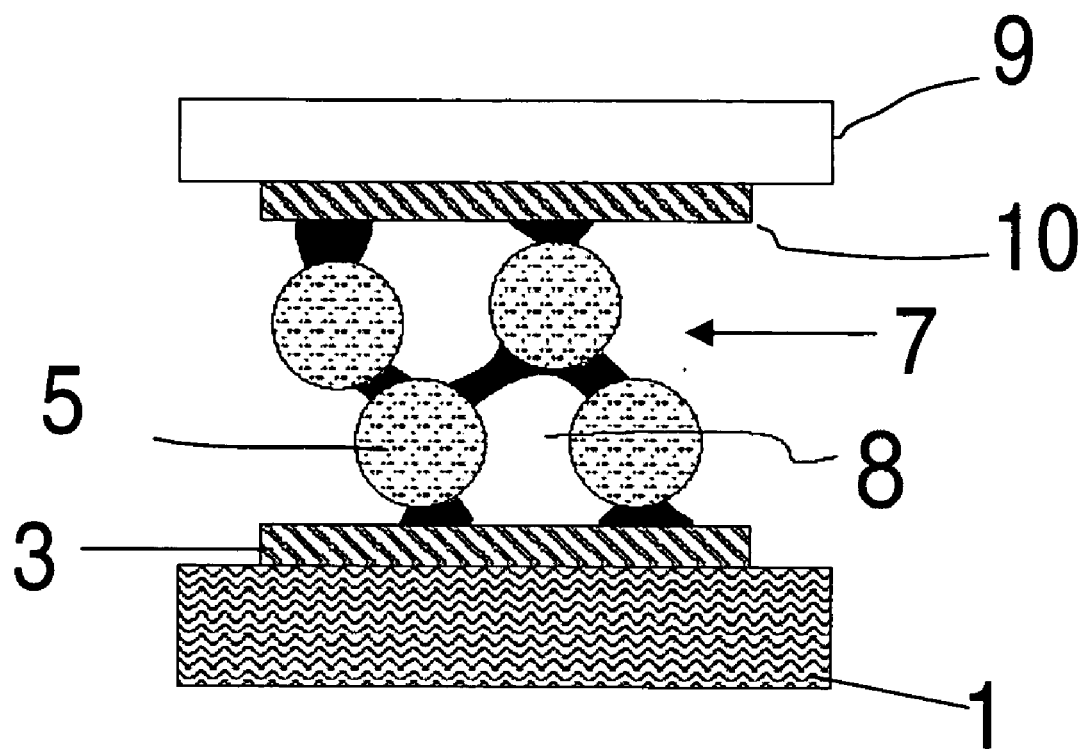
FIG. 4 shows a reflowed porous solder joint in accordance with an embodiment of the present disclosure.

As is shown in FIG. 4, once cooled, the molten solder hardens into a solder joint 7 between the substrate 1 and the electrical component 9. When the solder solidifies, pores 8 are left within the solder joint 7. These pores 8 may decrease the rigidity of the joint 7, allowing for greater elasticity and more compliancy when the substrate 1 and electrical component 9 have a large mismatch in physical dimensions between parts due to either a large mismatch in their coefficients of thermal expansion or mechanical deformity. Because of the spongy nature of the solder joint 7, the potential for cracking and fatigue is greatly reduced, as the pores 8 allow for greater stretching or compression within the solder joint 7 itself, particularly when compared a standard solid solder joint.

Besides being more elastic and less rigid, the pores 8 in the solder joint 7 may also serve as a crack terminator. That is, once a crack front runs into a pore 8, the high energy of the crack front may be dissipated by the elasticity of the large opening, and crack propagation may be stopped. The description below models a typical use for the spongy solder joint 7 represented in FIGS. 1–4.

EXAMPLES

Example 1

A joint between a ceramic coupon and an FR4 coupon may be made with a solder paste using 5.00 g of solder powder, 2.50 g of copper powder, and 2.13 g of flux. A cross section of the joint shows that there is approximately 2% porosity. The joint may be tested using an MTS lap shear tester. The load capacity of the joint is approximately 484 lbf/in$^2$. The joint may be stretched approximately 9.3 mils. The joint is less porous than the joint shown in FIGS. 1–4.

Example 2

A joint between a ceramic coupon and an FR4 coupon may be made with a solder paste using 5.00 g of solder powder, 5.00 g of copper powder, and 3.38 g of flux. A cross section of the joint shows that there is approximately 50% porosity. The joint may be tested using an MTS lap shear tester. The load capacity of the joint is approximately 325 lbf/in². The joint may be stretched approximately 7.5 mils. The joint is similar in porosity to the joint shown in FIGS. 1–4.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the following appended claims. Further, although the present disclosure has been described herein in the context of a particular implementation in a particular environment for a particular purpose, those of ordinary skill in the art will recognize that its usefulness is not limited thereto and that the present disclosure can be beneficially implemented in any number of environments for any number of purposes. Accordingly, the claims set forth below should be construed in view of the full breadth and spirit of the present disclosure as described herein.

What is claimed is:

1. A solder paste comprising:
   a solder powder;
   high melting temperature solderable particles; and
   a flux;
   wherein the high melting temperature solderable particles have a melting temperature higher than a soldering temperature of the solder paste, wherein the solder paste has a volume ratio of solder powder to high melting temperature solderable particles between 2:1 and 1:10, and wherein the high melting temperature solderable particles are treated chemically prior to mixing with the solder powder and flux.

2. A method of manufacturing a solder joint comprising:
   mixing a solder powder and high melting temperature solderable particles with a flux to form a solder paste, wherein the high melting temperature solderable particles have a melting temperature higher than a soldering temperature of the solder paste, wherein the solder paste has a volume ratio of solder powder to high melting temperature solderable particles between 2:1 and 1:10, and wherein the high melting temperature solderable particles are treated chemically prior to mixing with the solder powder and flux.

3. The method of claim 2, wherein the flux is a no-clean flux.

4. The method of claim 3, wherein the no-clean flux comprises a rosin, a resin, an organic acid, an organic base, organic solvents, or rheological additives, or combinations thereof.

5. The method of claim 2, wherein the solder joint comprises open spaces between the high melting temperature solderable particles.

6. The method of claim 2, wherein the solder joint can stretch between 1 mil and 30 mils.

7. The method of claim 2, wherein the solder joint has a porosity between 2% and 80%.

8. A method for connecting electrical components with solder interconnections comprising:
   chemically treating a high melting temperature solderable particle material wherein the solder paste has a volume ratio of solder powder to high melting temperature particle material between 2:1 and 1:10;
   mixing a solder powder, the high melting temperature solderable particle material, and a flux to form a solder paste, wherein the solder paste has a volume ratio of solder powder to high melting temperature solderable particle material between 2:1 and 1:10;
   dispensing or printing the solder paste onto a pad;
   placing a component onto the deposited solder paste to make an assembly;
   heating the assembly to a temperature above a melting temperature of the solder powder, but below that of the high melting temperature solderable particle material; and
   cooling the assembly.

9. The method of claim 8, wherein the flux is a no-clean flux.

10. The method of claim 9, wherein the no-clean flux comprises a rosin, a resin, an organic acid, an organic base, organic solvents, or rheological additives, or combinations thereof.

11. The solder paste of claim 1, wherein the flux is a no-clean flux.

12. The solder paste of claim 11, wherein the no-clean flux comprises a rosin, a resin, an organic acid, an organic base, organic solvents, or rheological additives, or combinations thereof.

13. The solder paste of claim 1, wherein the high melting temperature solderable particles have a melting temperature above 500° C.

14. The solder paste of claim 13, wherein the high melting temperature solderable particles comprise copper particles, nickel particles, or polymeric particles with solderable metal coatings, or combinations thereof.

15. The method of claim 2, wherein the high melting temperature solderable particles have a melting temperature above 500° C.

16. The method of claim 15, wherein the high melting temperature solderable particles comprise copper particles, nickel particles, or polymeric particles with solderable metal coatings, or combinations thereof.

17. The method of claim 8, wherein the high melting temperature solderable particle material has a melting temperature above 500° C.

18. The method of claim 17, wherein the high melting temperature solderable particle material comprises copper particles, nickel particles, or polymeric particles with solderable metal coatings, or combinations thereof.

19. The method of claim 8, wherein the high melting temperature solderable particle material has a melting temperature higher than a soldering temperature of the solder paste.

* * * * *